(12) United States Patent
Pillarisetty et al.

(10) Patent No.: US 8,283,653 B2
(45) Date of Patent: Oct. 9, 2012

(54) NON-PLANAR GERMANIUM QUANTUM WELL DEVICES

(75) Inventors: Ravi Pillarisetty, Portland, OR (US);
Jack T. Kavalieros, Portland, OR (US);
Willy Rachmady, Beaverton, OR (US);
Uday Shah, Portland, OR (US);
Benjamin Chu-Kung, Hillsboro, OR (US); Marko Radosavljevic, Beaverton, OR (US); Niloy Mukherjee, Beaverton, OR (US); Gilbert Dewey, Hillsboro, OR (US); Been Y. Jin, Lake Oswego, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 176 days.

(21) Appl. No.: 12/646,477

(22) Filed: Dec. 23, 2009

(65) Prior Publication Data
US 2011/0147711 A1    Jun. 23, 2011

(51) Int. Cl.
*H01L 29/06* (2006.01)

(52) U.S. Cl. ............... 257/20; 257/19; 257/18; 257/14; 257/15; 257/E29.005

(58) Field of Classification Search .......... 257/14, 257/15, 18, 19, 20, E29.005
See application file for complete search history.

(56) References Cited

U.S. PATENT DOCUMENTS

| | | | |
|---|---|---|---|
| 6,723,621 B1 * | 4/2004 | Cardone et al. | 438/478 |
| 7,429,747 B2 | 9/2008 | Hudait et al. | |
| 7,435,987 B1 | 10/2008 | Chui et al. | |
| 7,494,862 B2 | 2/2009 | Doyle et al. | |
| 7,569,443 B2 | 8/2009 | Kavalieros et al. | |
| 7,569,869 B2 | 8/2009 | Jin et al. | |
| 7,601,980 B2 | 10/2009 | Hudait et al. | |
| 2004/0061178 A1 | 4/2004 | Lin et al. | |
| 2005/0095763 A1 | 5/2005 | Samavedam et al. | |
| 2005/0184316 A1 * | 8/2005 | Kim et al. | 257/213 |
| 2006/0088967 A1 * | 4/2006 | Hsiao et al. | 438/296 |
| 2006/0148182 A1 | 7/2006 | Datta et al. | |
| 2006/0278915 A1 | 12/2006 | Lee et al. | |
| 2007/0187716 A1 * | 8/2007 | Chu | 257/192 |
| 2008/0050883 A1 | 2/2008 | Enicks | |
| 2008/0142786 A1 | 6/2008 | Datta et al. | |
| 2008/0157130 A1 | 7/2008 | Chang | |

(Continued)

OTHER PUBLICATIONS

U.S. Appl. No. 12/347,268, filed Dec. 31, 2008, 42 pages.

(Continued)

*Primary Examiner* — Matthew Reames
(74) *Attorney, Agent, or Firm* — Finch & Malony PLLC

(57) ABSTRACT

Techniques are disclosed for forming a non-planar germanium quantum well structure. In particular, the quantum well structure can be implemented with group IV or III-V semiconductor materials and includes a germanium fin structure. In one example case, a non-planar quantum well device is provided, which includes a quantum well structure having a substrate (e.g. SiGe or GaAs buffer on silicon), a IV or III-V material barrier layer (e.g., SiGe or GaAs or AlGaAs), a doping layer (e.g., delta/modulation doped), and an undoped germanium quantum well layer. An undoped germanium fin structure is formed in the quantum well structure, and a top barrier layer deposited over the fin structure. A gate metal can be deposited across the fin structure. Drain/source regions can be formed at respective ends of the fin structure.

20 Claims, 9 Drawing Sheets

U.S. PATENT DOCUMENTS

2008/0203381 A1  8/2008  Hudait et al.
2008/0237573 A1  10/2008 Jin et al.
2008/0237577 A1  10/2008 Chui et al.
2009/0057648 A1  3/2009  Hudait et al.
2009/0242872 A1  10/2009 Pillarisetty et al.
2009/0242873 A1  10/2009 Pillarisetty et al.

OTHER PUBLICATIONS

U.S. Appl. No. 12/378,828, filed Feb. 20, 2009, 26 pages.
International Search Report and Written Opinion received for PCT Patent Application No. PCT/US2010/057276, mailed on Jun. 30, 2011, 9 pages.

* cited by examiner

NON-PLANAR GERMANIUM QUANTUM WELL DEVICES

BACKGROUND

Quantum well transistor devices formed in epitaxially grown semiconductor heterostructures, typically in III-V or silicon-germanium/germanium (SiGe/Ge) material systems, offer exceptionally high carrier mobility in the transistor channel due to low effective mass along with reduced impurity scattering due to delta doping. In addition, these devices provide exceptionally high drive current performance. However, because quantum well transistors are formed in epitaxially grown heterostructures, the resulting structure consists of several perpendicular epitaxial layers, allowing for only planar types of quantum well devices to be formed.

DETAILED DESCRIPTION

Figure 1:
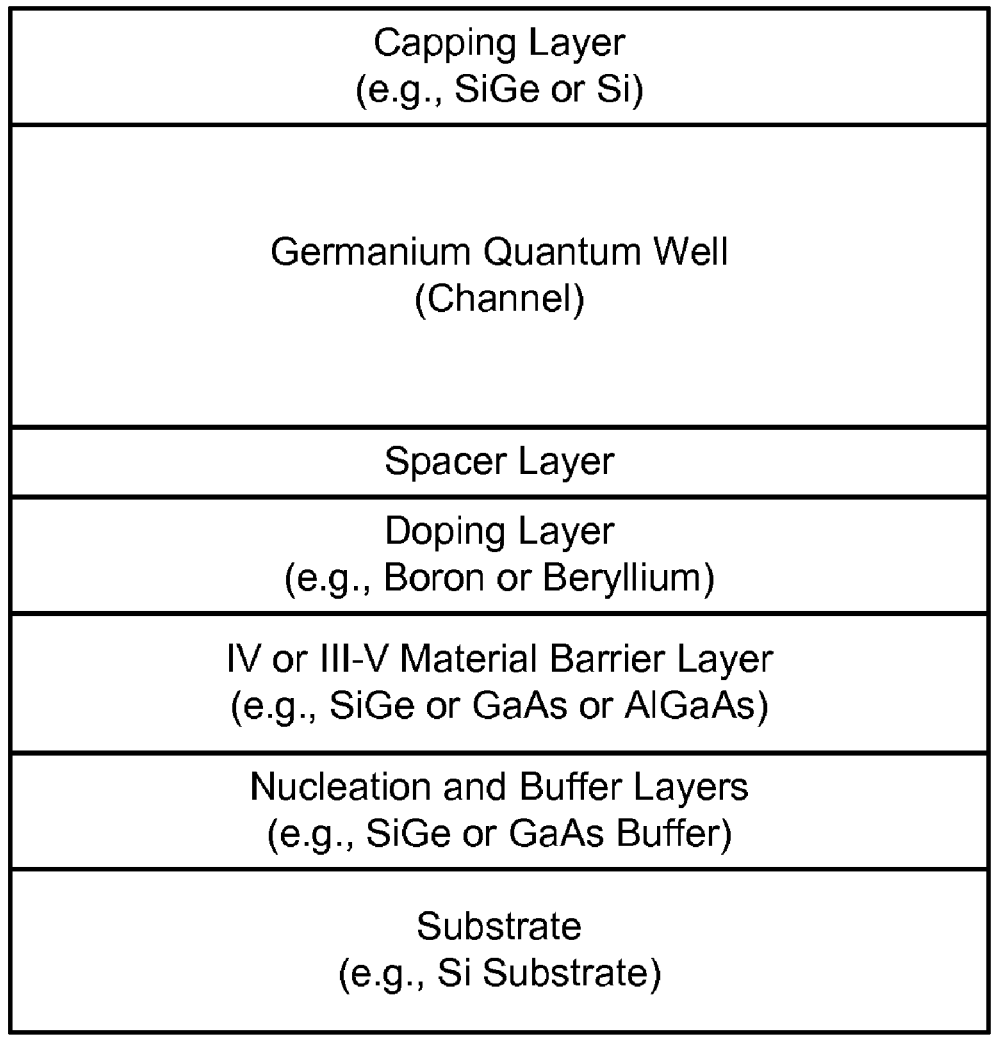
FIG. 1 illustrates a cross-sectional side view of an example quantum well growth structure that can be used in producing a non-planar germanium quantum well device, in accordance with one embodiment of the present invention.

Techniques are disclosed for forming a non-planar germanium quantum well structure. In particular, the quantum well structure can be implemented with group IV or III-V semiconductor materials and includes a germanium fin structure, so as to effectively provide a hybrid structure. The techniques can be used, for example, to improve short channel effects and gate length (Lg) scalability in a modulation/delta doped non-planar device. Electrostatics benefits of a fin-based device are achieved, while simultaneously retaining the high mobility benefits of a modulation/delta doped device.

General Overview

As previously explained, quantum well transistor devices formed in epitaxially grown semiconductor heterostructures, typically in III-V material systems, offer very high carrier mobility in the transistor channel due to low effective mass along with reduced impurity scattering due to modulation delta doping. These conventional devices provide exceptionally high drive current performance. Such quantum well systems are typically fabricated with planar architectures.

Non-planar transistor architectures, such as FinFET structures (e.g., double-gate, tri-gate and surround gate structures), can be used to improve electrostatics and short channel effects, and hence enable Lg scalability. However, such non-planar architectures are generally regarded as incompatible with high quality, high mobility, doped quantum well transistors formed in epitaxially grown heterostructures.

Thus, and in accordance with an embodiment of the present invention, a modulation doped non-planar Ge quantum well transistor device is provided. The device can be formed from semiconductor heterostructures, such as Ge, SiGe, Si, and/or gallium arsenide (GaAs) or aluminum arsenide (AlAs). Any number of epitaxially grown heterostructures fabricated with group IV or III-V materials can be configured with a germanium fin-based channel. The device may include, for example, delta doping in a larger band gap material, which modulation dopes a lower band gap material. The lower band gap material is epitaxially grown after the larger band gap material and delta doping. The heterostructure can be patterned and etched into one or more narrow fins, and the delta/modulation doped lower band gap material in those fins forms the active body of the device.

The process flow for fabricating the device can be implemented, for example, in a similar fashion to that used in fabricating a conventional silicon based non-planar device, including shallow trench isolation (STI), gate stack, source/drain regions, and contact formation. However, in contrast to conventional non-planar devices, which contain high levels of doping in the active body of the device, the active body of the germanium fin structure does not contain dopants (as the device is modulation/delta doped), which provides a significant enhancement to carrier mobility, due to improved Coulomb scattering.

The non-planar undoped Ge fin-based device generally exhibits improved device electrostatics, including significant Lg and threshold voltage (Vt) scalability, relative to conventional modulation doped planar quantum well devices formed in semiconductor heterostructures. Other advantages will be apparent in light of this disclosure. For instance, one advantage of a III-V/Ge hybrid system configured in accordance with an embodiment of the present invention is that etch selectivity between the III-V materials (in the barrier layer) and Ge (in the fin structure) could be used in the shallow trench isolation (STI) process, in which the STI etch is only taken to the Ge/III-V interface.

Thus, given a desired Ge quantum well structure, a fin structure (along with gate, source and drain regions, and contacts, etc) can be formed in accordance with an embodiment of the present invention. So, in accordance with one example embodiment, formation of a modulation doped non-planar Ge quantum well transistor device may generally include the growth of the underlying quantum well structure (or any portion thereof), prior to formation of the Ge fin structure. An alternative embodiment assumes the quantum well structure is pre-formed in advance, and the Ge fin structure is subsequently formed therein.

Quantum Well Structure

FIG. 1 illustrates a cross-sectional side view of an example Ge quantum well growth structure that can be used in producing a non-planar germanium quantum well device, in accordance with one embodiment of the present invention. The quantum well growth structure can be, for example, a conventional SiGe/Ge or GaAs/Ge quantum well structure with a capping layer. As previously explained, however, note that a modulation/delta doped non-planar Ge quantum well transistor device formed in accordance with an embodiment of the present invention can be implemented with any number of quantum well growth structures, configured with various IV or III-V materials, doping layers, and buffer layers, as will be apparent in light of this disclosure. The claimed invention is not intended to be limited to any particular quantum well growth configuration.

As can be seen in FIG. 1, the quantum well growth structure includes a substrate, upon which nucleation and buffer layers are formed. The structure further includes a group IV or III-V material barrier layer upon which a doping layer is formed, upon which a spacer layer is formed, upon which a Ge quantum well layer is formed. A capping layer is provided on the Ge quantum well layer. Each of these example layers will be discussed in turn. Other embodiments may include fewer layers (e.g., fewer buffer layers and/or no capping layer) or more layers (e.g., additional spacer and/or doped layers below quantum well layer) or different layers (e.g., formed with different semiconductor materials, formulations, and/or dopants). The layers may be implemented with any suitable layer thicknesses and other desired layer parameters, using established semiconductor processes (e.g., metal organic chemical vapor deposition, molecular beam epitaxy, photolithography, or other such suitable processes), and may be graded (e.g., in linear or step fashion) to improve lattice constant match between neighboring layers of otherwise lattice diverse materials. In general, the specific layers and dimensions of the structure will depend on factors such as the desired device performance, fab capability, and semiconductor materials used.

The substrate may be implemented as typically done, and any number of suitable substrate types and materials can be used here (e.g., p-type, n-type, neutral-type, silicon, germanium, high or low resistivity, off-cut or not off-cut, bulk, silicon-on-insulator, etc). In one example embodiment, the substrate is a bulk Si substrate. In another example embodiment, the substrate is a bulk Ge substrate. Other embodiments may use a semiconductor on insulator configuration, such as silicon on insulator (SOI) or germanium on insulator (GeOI) or SiGe on insulator (SiGeOI).

The nucleation and buffer layers are formed on the substrate, and also may be implemented as typically done. In one specific example embodiment, the nucleation and buffer layers are made of SiGe (e.g., 60% Ge) or GaAs and have an overall thickness of about 0.5 to 2.0 μm (e.g., nucleation layer of about 25 nm to 50 nm thick and the buffer layer is about 0.3 μm to 1.9 μm thick). As is known, the nucleation and buffer layers can be used to fill the lowest substrate terraces with atomic bi-layers of, for example, III-V materials such as GaAs material. The nucleation layer can be used to create an anti-phase domain-free virtual polar substrate, and the buffer layer may be used to provide a dislocation filtering buffer that can provide compressive strain for a quantum well structure and/or control of the lattice mismatch between the substrate and the barrier layer. The buffer layers may also include a graded buffer, which can also be implemented as conventionally done. As is known, by forming the graded buffer layer, dislocations may glide along relatively diagonal planes there within so as to effectively control the lattice mismatch between the substrate and the IV/III-V material barrier layer (and/or any intervening layers). As will be apparent, such graded layers can be used in other locations of/within the quantum well structure or stack. Note that other quantum well structures that can benefit from an embodiment of the present invention may be implemented without the nucleation and/or buffer layers. For example, embodiments having a substrate and barrier layer that are implemented with materials having sufficiently similar lattice constants may be implemented without a graded buffer.

The IV/III-V barrier layer is formed on the nucleation and buffer layer in this example embodiment, and can also be implemented as conventionally done. In one specific example embodiment, the barrier layer is implemented with $Si_{1-x}Ge_x$ (where x is in the range of 40 to 80, such as 60), or GaAs, or $Al_{1-x}Ga_xAs$ (where x is in the range of 50 to 90, such as 70), and has a thickness in the range of 4 nm and 120 nm (e.g., 100 nm, +/−20 nm). Generally, the barrier layer is formed of a material having a higher band gap than that of the material forming the overlying quantum well layer, and is of sufficient thickness to provide a potential barrier to charge carriers in the transistor channel. As will be appreciated, the actual make up and thickness of the barrier layer will depend on factors such as the substrate and quantum well layer materials and/or thicknesses. Numerous such barrier materials and configurations can be used here, as will be appreciated in light of this disclosure.

The doping layer is formed on (or within) the barrier layer in this example quantum well growth structure, and can also be implemented as conventionally done. In general, the barrier layer can be doped by the doping layer to supply carriers to the quantum well layer. The doping layer can be, for example, delta doped (or modulation doped). For an n-type device utilizing a SiGe material barrier layer, the doping may be implemented, for example, using boron and/or tellurium impurities, and for a p-type device the doping layer may be implemented, for example, using beryllium (Be) and/or carbon. The thickness of the doping layer will depend on factors such as the type of doping and the materials used. For instance, in one example embodiment the doping layer is a layer of boron delta doped $Si_{40}Ge_{60}$ having a thickness between about 3 Å to 15 Å. In another embodiment, the doping layer is a layer of Be modulation doped GaAs having a thickness between about 15 Å to 60 Å. The doping can be selected, for instance, based upon the sheet carrier concentration that is useful in the channel of the Ge quantum well layer. As will be appreciated in light of this disclosure, an embodiment of the present invention may be implemented with quantum well structures having any type of suitable doping layer or layers.

The spacer layer is formed on (or over) the doping layer, and can also be implemented as conventionally done. In one specific example embodiment, the spacer layer is implemented with $Si_{1-x}Ge_x$ (where x is in the range of 40 to 80, such as 60), or GaAs, or $Al_{1-x}Ga_xAs$ (where x is in the range of 50 to 90, such as 70), and has a thickness in the range of 0.2 nm to 70 nm (e.g., 5 nm). In general, the spacer layer can be configured to provide compressive strain to the quantum well layer as it acts as a semiconductive channel. Note that other quantum well structures that can benefit from an embodiment of the present invention may be implemented without the spacer layer.

The quantum well layer can also be implemented as conventionally done. In general, the quantum well layer is implemented with undoped germanium, having an example thickness of about 20 Å to 500 Å. Numerous other quantum well layer configurations can be used here, as will be appreciated. In a more general sense, the quantum well layer has a smaller band gap than that of the IV/III-V barrier layer, is undoped, and is of a sufficient thickness to provide adequate channel conductance for a given application such as a transistor for a memory cell or a logic circuit. The quantum well layer may be strained by the barrier layer, an upper barrier layer, or both.

After formation of the device stack, which generally includes the substrate through the quantum well layer as previously described, a capping layer can be formed over the quantum well layer. In one specific example embodiment, the capping layer is implemented with SiGe or Si and has a thickness in the range of 2 to 10 nm (e.g., 6 nm). As will be appreciated, other suitable capping layer materials may be used to protect the underlying germanium quantum well layer.

Ge Fin-Based and Modulation Doped Quantum Well Device

FIGS. 2 through 8 illustrate with cross-sectional and perspective views the formation of a Ge fin-based quantum well structure configured in accordance with an embodiment of the present invention. As will be appreciated, the fin-based structure can be formed on the device stack shown in FIG. 1, or any number of other modulation/delta doped quantum well growth structures having an undoped Ge channel. Note that intermediate processing, such as planarization (e.g., chemical mechanical polishing, or CMP) and subsequent cleaning processes, may be included throughout the formation process, even though such processing may not be expressly discussed.

Figure 2:
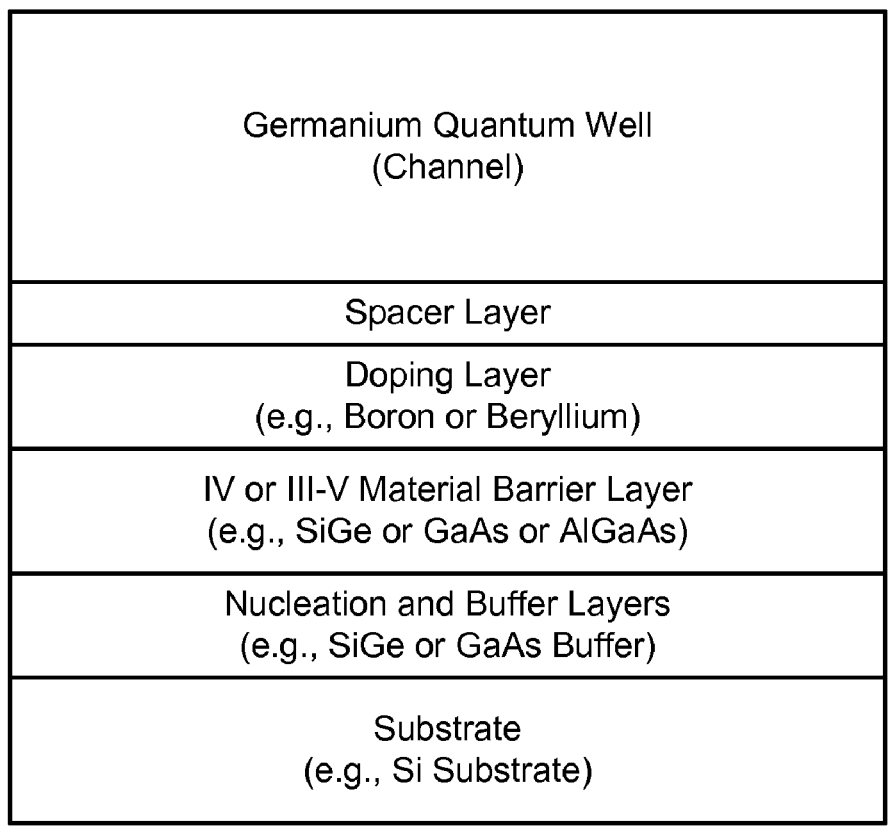
FIG. 2 illustrates removal of the capping layer from the quantum well growth structure of FIG. 1, in accordance with one embodiment of the present invention.

FIG. 2 illustrates removal of the capping layer from the quantum well growth structure of FIG. 1, in accordance with one embodiment of the present invention. In one such embodiment, the capping layer is SiGe (e.g., 60% Ge) or Si. In any case, the capping layer can be removed, for example, by etching (wet and/or dry etch) to expose the underlying Ge quantum well layer.

Figure 3:
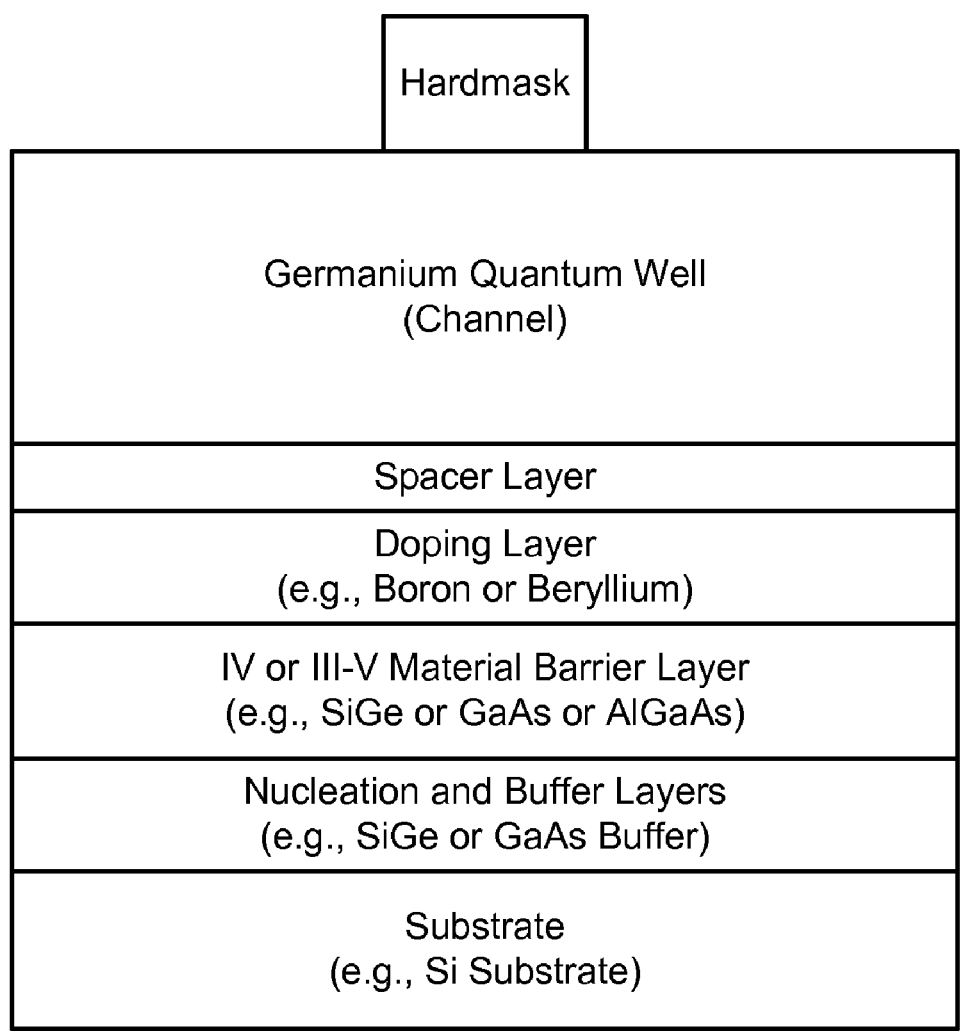
FIG. 3 illustrates deposition and patterning of a hardmask on the quantum well growth structure of FIG. 2, in accordance with one embodiment of the present invention.

FIG. 3 illustrates deposition and patterning of a hardmask on the quantum well growth structure of FIG. 2, in accordance with one embodiment of the present invention. This patterning, which is for shallow trench isolation (STI) formation, can be carried out using standard photolithography, including deposition of hardmask material (e.g., such as silicon dioxide, silicon nitride, and/or other suitable hardmask materials), patterning the resist on a portion of the hardmask that will remain temporarily to protect the underlying fin structure (Ge channel in this case), etching to remove the unmasked (no resist) portions of the hardmask (e.g., using a dry etch, or other suitable hardmask removal process), and then stripping the patterned resist. In the example embodiment shown in FIG. 3, the resulting hardmask is central to the device stack and formed in one location, but in other embodiments, the hardmask may be offset to one side of the stack and/or located in multiple places on the stack, depending on the particular active device.

Figure 4:
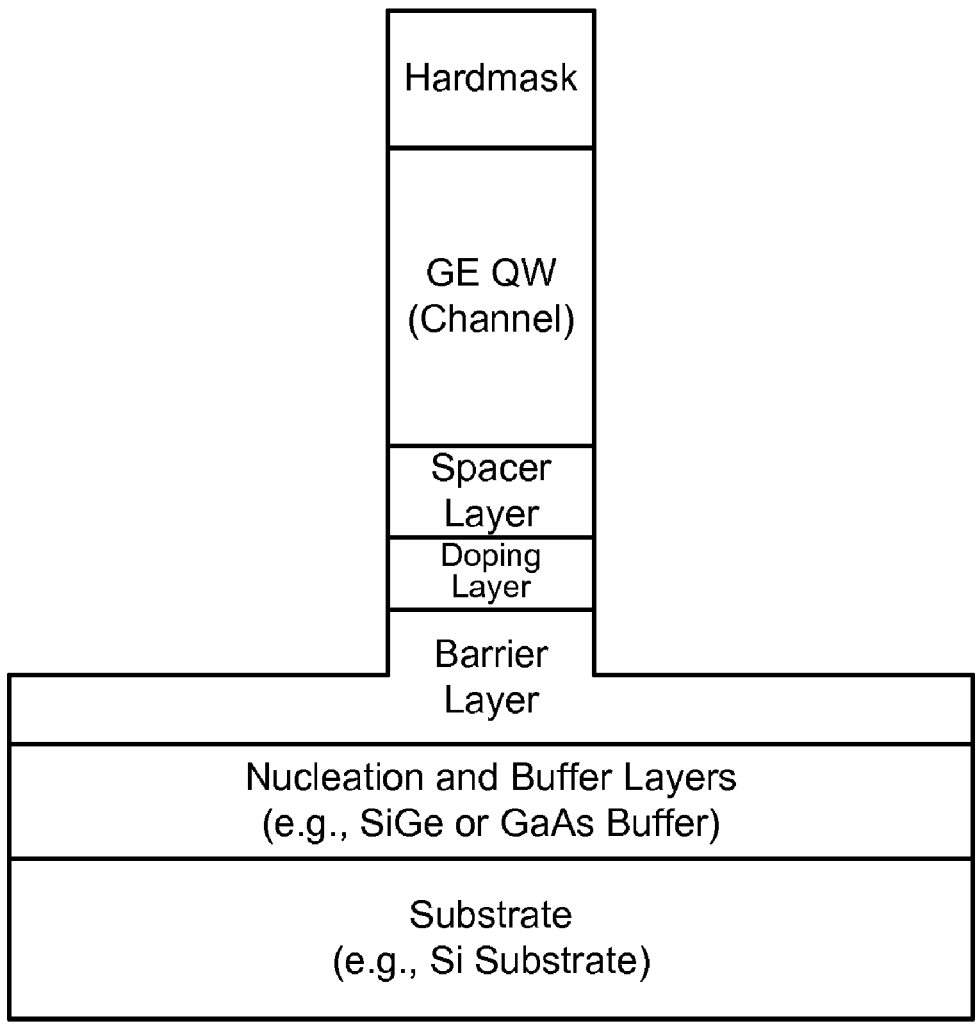
FIG. 4 illustrates a shallow trench isolation (STI) etch to form a germanium fin structure on the quantum well growth structure of FIG. 3, in accordance with one embodiment of the present invention.
Figure 5:
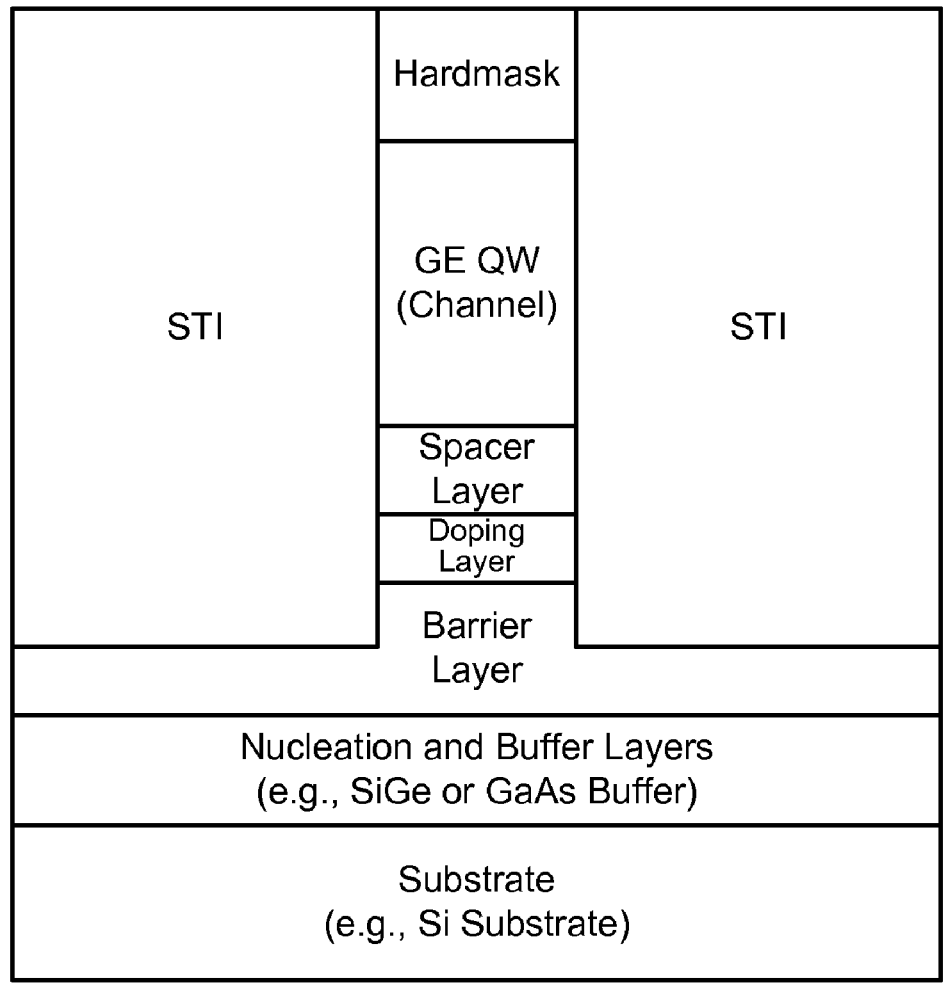
FIG. 5 illustrates deposition and planarization of dielectric material around the germanium fin structure of the quantum well growth structure of FIG. 4, in accordance with one embodiment of the present invention.

FIG. 4 illustrates a shallow trench isolation (STI) etch to form a germanium fin structure on the quantum well growth structure of FIG. 3, and FIG. 5 illustrates deposition and planarization of dielectric material around the germanium fin structure, in accordance with one embodiment of the present invention. This can also be carried out using standard photolithography, including etching to remove portions of the stack that are unprotected by the hardmask (e.g., wet or dry etch), and deposition of a dielectric material (e.g., such as $SiO_2$, or other suitable dielectric materials). The depth of the STI etch may vary, but in some example embodiments is in the range of 0 Å to 5000 Å below the bottom of the Ge quantum well layer. In this example embodiment, the etch depth is almost to the bottom of the barrier layer. In general, the etch should be to a sufficient depth that allows the quantum well channel to be electrically isolated (e.g., from neighboring component or other potential interference sources). After formation of the STI and deposition of dielectric material, the deposited dielectric materials can be polished/planarized (e.g., using CMP). Note the hardmask can be left on to protect the germanium channel.

Figure 6:
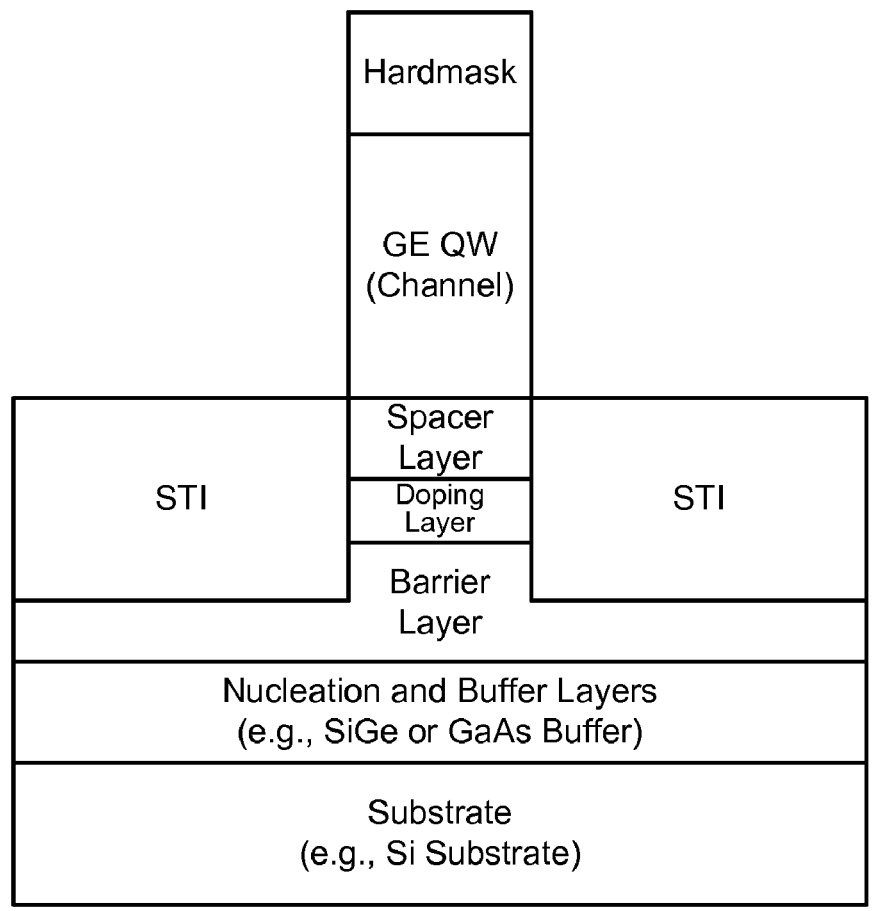
FIG. 6 illustrates etching to recess the STI dielectric material of the quantum well growth structure of FIG. 5, in accordance with one embodiment of the present invention.

FIG. 6 illustrates etching to recess the STI dielectric material of the quantum well growth structure of FIG. 5, in accordance with one embodiment of the present invention. This can also be carried out using standard photolithography, including etching to remove the dielectric material (e.g., using wet etch, but dry etch may be used as well). The depth of the recess etch may vary, but is generally between the bottom of the germanium quantum well layer (channel) and above the doping layer. As can be seen, in this example embodiment, the recess etch depth is to the bottom of the germanium quantum well layer (channel). Note the hardmask is still in place to protect the Ge fin structure (or channel).

Figure 7:
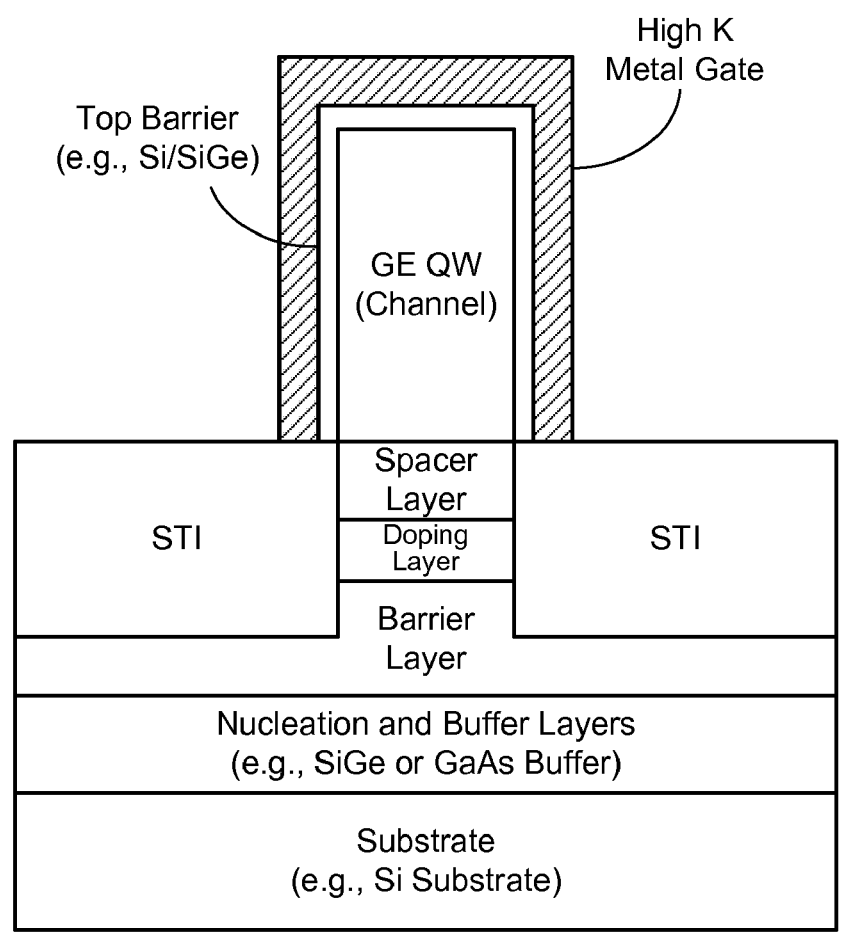
FIG. 7 illustrates gate electrode formation on the germanium fin structure of the quantum well growth structure of FIG. 6, in accordance with one embodiment of the present invention.
Figure 8:
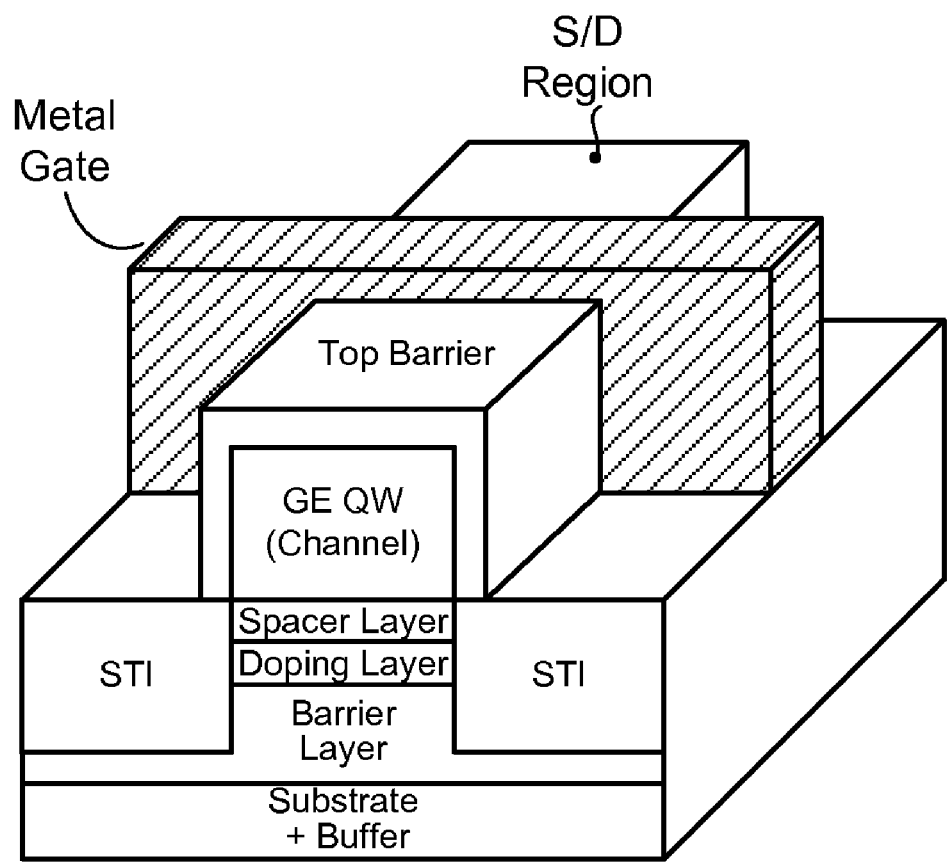
FIG. 8 illustrates a perspective view of the device shown in FIG. 7, configured in accordance with one embodiment of the present invention.

FIG. 7 illustrates gate electrode formation on the germanium fin structure of the quantum well growth structure of FIG. 6, in accordance with one embodiment of the present invention. The resulting structure, shown in perspective view in FIG. 8, is effectively a Ge quantum well structure configured as a FinFET device (hence, non-planar). As is known, a FinFET is a transistor built around a thin strip of semiconductor material (generally referred to as the fin). The FinFET device includes the standard field effect transistor (FET) nodes, including a gate, a gate dielectric (typically high-k), a source region, and a drain region (only one of source/drain regions is generally shown in FIG. 8). The conductive channel of the device resides on the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as so-called double-gate FinFETs, in which the conductive channel principally resides only along the two sidewalls of the fin (and not along the top of the fin).

As can be seen be in FIG. 7, the hardmask is removed (e.g., wet or dry etch) and a top barrier is deposited over the Ge channel, which is undoped in light of the doping layer. This top barrier can be, for example, a deposited layer Si/SiGe. The thickness of the top barrier layer can be, for example, 10 Å to 100 Å (e.g., 50 Å). In general, the top barrier layer can be formed of any suitable material having a higher band gap than the Ge material forming the underlying quantum well channel, and is of sufficient thickness to provide a potential barrier to charge carriers in the transistor channel. The high-k gate dielectric deposited on the top barrier can be, for instance, a film having a thickness in the range of 10 Å to 50 Å (e.g., 20 Å), and can be implemented, for instance, with hafnium oxide, alumina, tantalum pentaoxide, zirconium oxide, lanthanum aluminate, gadolinium scandate, hafnium silicon oxide, lanthanum oxide, lanthanum aluminum oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or other such materials having a dielectric constant greater than that of, for instance, silicon dioxide. The gate metal deposited over the high-k gate dielectric can be, for example, nickel, gold, platinum, aluminum, titanium, palladium, titanium nickel or other suitable gate metal or alloy. Source and drain regions can be formed as conventionally done for a FinFET structure, and may be configured with the same metal as the gate or another suitable contact metal. As will be appreciated in light of this disclosure, the top barrier, high-k gate dielectric, gate metal, and source/drain regions can be implemented using standard FinFET processing.

Thus, techniques provided herein employ modulation doping techniques normally used in fabricating planar quantum well stacks in the context of a non-planar architecture to provide a FinFET device having an undoped Ge channel. The device can be implemented using a number of suitable IV/III-V materials, such as SiGe, GaAs, or AlGaAs. The resulting integrated circuit device as illustrated can be used as a transistor that may be installed in any of several microelectronic devices, such as a central processing unit, memory array, on-chip cache, or logic gate. Likewise, numerous system level applications can employ integrated circuits as described herein.

Methodology

Figure 9:
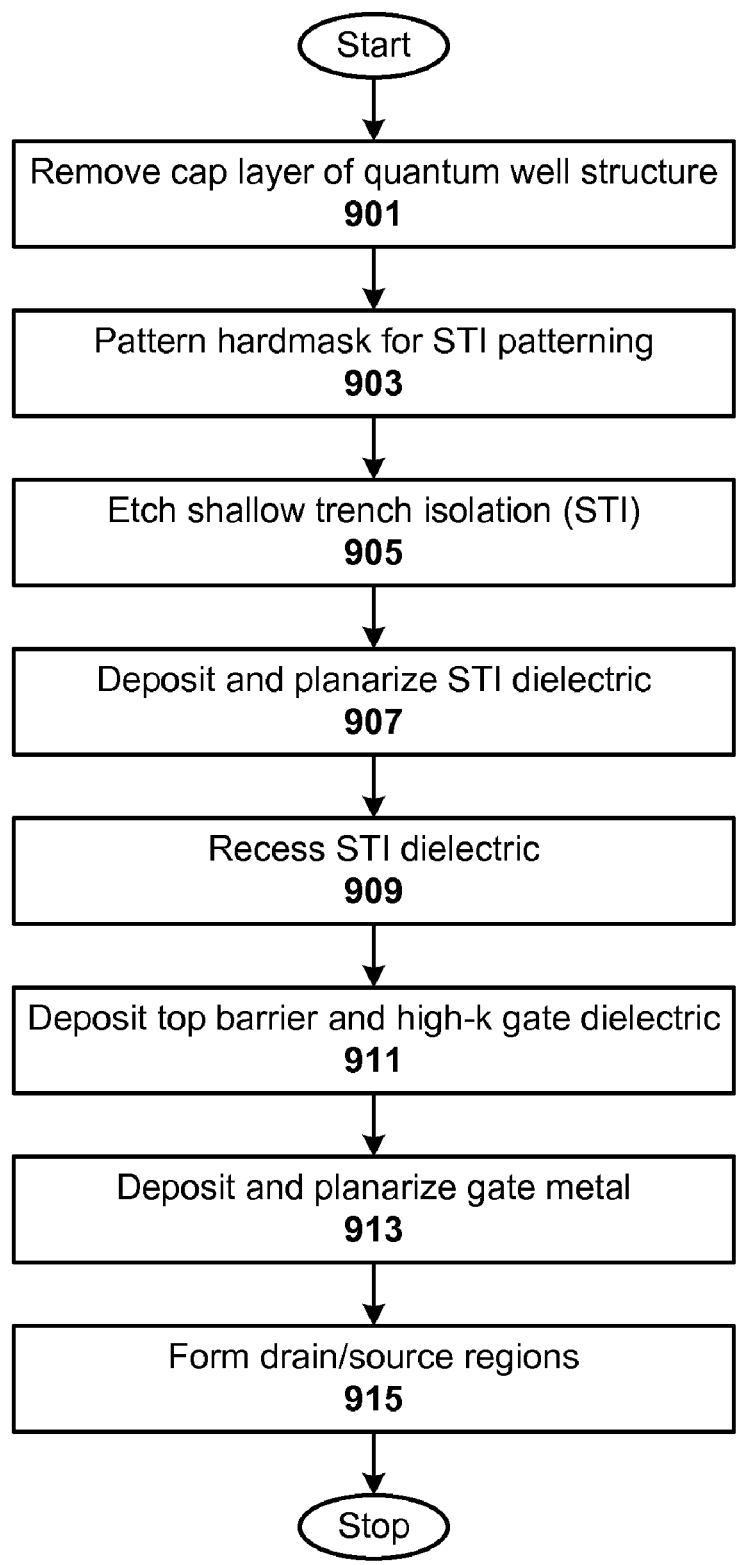
FIG. 9 illustrates a method for forming a germanium fin based modulation doped quantum well structure, in accordance with one embodiment of the present invention.

FIG. 9 illustrates a method for forming a germanium fin based modulation/delta doped quantum well structure, in accordance with one embodiment of the present invention. The quantum well structure can be configured as desired, and generally includes a stack that includes a substrate, a IV/III-V barrier layer, a doping layer (modulation/delta doped), and a quantum well layer.

The method includes removing 901 a cap layer (if applicable) of the quantum well structure, to expose the underlying Ge quantum well structure. The capping layer can be removed, for example, using a wet or dry etch. The method continues with patterning 903 a hardmask for shallow trench isolation (STI) patterning. The patterning may include, for instance, deposition of hardmask material, patterning resist on a portion of the hardmask that will remain temporarily to protect the underlying fin structure of the device during STI etching, etching to remove the unmasked (no resist) portions of the hardmask (e.g., using a dry etch, or other suitable hardmask removal process), and then stripping the patterned resist, to provide a patterned STI hardmask.

The method continues with etching 905 an STI into Ge quantum well structure, thereby forming a fin structure. In one example case, and as previously explained, the trench formation can be carried out using one or more dry and/or wet etches. The method continues with depositing 907 dielectric material into the STI and planarizing that dielectric material. The method continues with etching 909 to recess the STI material (e.g., down to the bottom of the Ge quantum well layer and before the doping layer). The etch can be implemented, for instance, with a wet etch.

The method continues with depositing 911 a top barrier and optional high-k gate dielectric over the fin structure. As previously explained, the top barrier can be formed of any suitable material (e.g., Si/SiGe) having a higher band gap than the Ge material forming the underlying quantum well channel, and is of sufficient thickness to provide a potential barrier to charge carriers in the transistor channel. The high-k gate dielectric can be, for instance, a film having a suitable thickness to sufficiently isolate the metal gate and a dielectric constant greater than that of, for instance, silicon dioxide. Other suitable gate dielectrics can be used (e.g., non-high-k dielectrics) here as well, and in some embodiments where the top barrier provides sufficient isolation on its own, no gate dielectric may be needed. The method continues with depositing 913 gate metal over the top barrier and across the isolated Ge fin structure forming the device channel, and forming 915 drain and source regions at respective ends of the fin structure (channel). The gate metal and source/drain regions can be implemented using standard processing (deposition, masking, etching, planarizing, etc).

Thus, a non-planar modulation/delta doped quantum well structure configured with an undoped germanium channel is provided. The structure can be used, for example, as a FinFET device (e.g., double-gate or tri-gate FinFET) suitable for use in numerous applications (e.g., processors, memory, etc).

Numerous embodiments and configurations will be apparent in light of this disclosure. For instance, one example embodiment of the present invention provides a method for forming a non-planar quantum well structure. The method includes receiving a quantum well structure having a substrate, a IV or III-V material barrier layer, a doping layer, and an undoped germanium quantum well layer. The method further includes selectively etching the quantum well structure to form a germanium fin structure, depositing a top barrier layer over the fin structure, and depositing gate metal across the fin structure. In one particular case, selectively etching the quantum well structure includes patterning a hardmask on the quantum well structure for shallow trench isolation (STI) patterning, etching an STI into the quantum well structure, depositing dielectric material into the STI, and planarizing the dielectric material. In one such case, the dielectric material in the STI is recessed down to a bottom of the germanium quantum well layer. The method may include forming drain and source regions at respective ends of the fin structure. The method may include removing a cap layer of the quantum well structure, to expose the germanium quantum well structure. In another particular case, after depositing a top barrier layer over the fin structure and prior to depositing gate metal across the fin structure, the method further includes depositing a high-k gate dielectric layer over the top barrier layer. The quantum well structure can be, for example, an epitaxially grown heterostructure. The doping layer may include, for instance, delta doping which modulation dopes the undoped germanium quantum well layer. In another particular case, the undoped germanium quantum well layer can be epitaxially grown after the doping layer.

Another example embodiment of the present invention provides a non-planar quantum well device. The device includes a quantum well structure having a substrate, a IV or III-V material barrier layer, a doping layer, and an undoped germanium quantum well layer. The device further includes an undoped germanium fin structure formed in the quantum well structure, a top barrier layer deposited over the fin structure, and gate metal deposited across the fin structure. The device may include, for example, recessed dielectric material in shallow trench isolation (STI) proximate the fin structure. In one such case, the dielectric material in the STI is recessed down to a bottom of the germanium quantum well layer. The device may include drain and source regions formed at respective ends of the fin structure. The device may include a high-k gate dielectric deposited between the top barrier layer and gate metal. In one example case, the non-planar quantum well structure comprises a FinFET device. In another example case, the IV or III-V material barrier layer is implemented with silicon germanium or gallium arsenide or aluminum gallium arsenide, and the substrate comprises a silicon germanium or gallium arsenide buffer on silicon. In another example case, the quantum well structure is an epitaxially grown heterostructure. In another example case, the doping layer includes delta doping, which modulation dopes the undoped germanium quantum well layer. In another example case, the undoped germanium quantum well layer is expitaxially grown after the doping layer (on or within the barrier layer).

Another example embodiment of the present invention provides a non-planar quantum well device. In this example, the device includes a quantum well structure having a substrate, a IV or III-V material barrier layer, a doping layer, and an undoped germanium quantum well layer. The quantum well structure is an epitaxially grown heterostructure, wherein the undoped germanium quantum well layer is epitaxially grown after the doping layer, and the doping layer modulation dopes the undoped germanium quantum well layer. The device further includes an undoped germanium fin structure formed in the quantum well structure, a top barrier layer deposited over the fin structure, and a gate metal deposited across the fin structure. In addition, the device includes drain and source regions formed at respective ends of the fin structure, and a high-k gate dielectric deposited between the top barrier layer and gate metal.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A method for forming a non-planar quantum well structure, comprising:
   receiving a quantum well structure having a substrate, a IV or III-V material barrier layer, a doping layer, and an undoped germanium quantum well layer;
   selectively etching the quantum well structure to form a germanium fin structure;
   depositing a top barrier layer of semiconductor material over the fin structure; and
   depositing gate metal across the fin structure.

2. The method of claim 1 wherein selectively etching the quantum well structure comprises:
   patterning a hardmask on the quantum well structure for shallow trench isolation (STI) patterning;
   etching an STI into the quantum well structure;
   depositing dielectric material into the STI; and
   planarizing the dielectric material.

3. The method of claim 2 wherein the dielectric material in the STI is recessed down to a bottom of the germanium quantum well layer.

4. The method of claim 1 further comprising:
   forming drain and source regions at respective ends of the fin structure.

5. The method of claim 1 further comprising:
   removing a cap layer of the quantum well structure, to expose the germanium quantum well structure.

6. The method of claim 1 wherein after depositing a top barrier layer over the fin structure and prior to depositing gate metal across the fin structure, the method further comprises:
   depositing a high-k gate dielectric layer over the top barrier layer.

7. The method of claim 1 wherein the quantum well structure is an epitaxially grown heterostructure.

8. The method of claim 1 wherein the doping layer includes delta doping, which modulation dopes the undoped germanium quantum well layer.

9. The method of claim 3 wherein the fin structure has a top and opposing sidewall portions extending from the top to the recessed dielectric material, and wherein the top barrier layer covers the top and sidewall portions of the fin structure.

10. A non-planar quantum well device, comprising:
    a quantum well structure having a substrate, a IV or III-V material barrier layer, a doping layer, and an undoped germanium quantum well layer;
    an undoped germanium fin structure formed in the quantum well structure;
    a top barrier layer of semiconductor material deposited over the fin structure; and
    gate metal deposited across the fin structure.

11. The device of claim 10 further comprising:
    recessed dielectric material in shallow trench isolation (STI) proximate the fin structure.

12. The device of claim 11 wherein the dielectric material in the STI is recessed down to a bottom of the germanium quantum well layer.

13. The device of claim 10 further comprising:
    drain and source regions formed at respective ends of the fin structure.

14. The device of claim 10 further comprising:
    a high-k gate dielectric deposited between the top barrier layer and gate metal.

15. The device of claim 10 wherein the device comprises a FinFET device.

16. The device of claim 10 wherein the IV or III-V material barrier layer is implemented with silicon germanium or gallium arsenide or aluminum gallium arsenide, and the substrate comprises a silicon germanium or gallium arsenide buffer on silicon.

17. The device of claim 10 wherein the IV or III-V material barrier layer comprises III-V material.

18. The device of claim 10 wherein the doping layer includes delta doping, which modulation dopes the undoped germanium quantum well layer.

19. The device of claim 12 wherein the fin structure has a top and opposing sidewall portions extending from the top to the recessed dielectric material, and wherein the top barrier layer covers the top and sidewall portions of the fin structure.

20. A non-planar quantum well device, comprising:
    a quantum well structure having a substrate, a IV or III-V material barrier layer, a doping layer, and an undoped germanium quantum well layer,
    an undoped germanium fin structure formed in the quantum well structure;
    a top barrier layer of semiconductor material deposited over the fin structure, wherein the fin structure has a top and opposing sidewall portions extending from the top toward the substrate and the top barrier layer covers the top and sidewall portions of the fin structure;
    gate metal deposited across the fin structure;
    drain and source regions formed at respective ends of the fin structure; and
    a high-k gate dielectric deposited between the top barrier layer and gate metal.

* * * * *

UNITED STATES PATENT AND TRADEMARK OFFICE
CERTIFICATE OF CORRECTION

| | | |
|---|---|---|
| PATENT NO. | : 8,283,653 B2 | Page 1 of 1 |
| APPLICATION NO. | : 12/646477 | |
| DATED | : October 9, 2012 | |
| INVENTOR(S) | : Ravi Pillarisetty et al. | |

It is certified that error appears in the above-identified patent and that said Letters Patent is hereby corrected as shown below:

On the first page, in field (74), in column 2, under "Attorney, Agent, or Firm", line 1, delete "Finch & Malony PLLC" and insert -- Finch & Maloney PLLC --, therefor.

In column 10, line 45, in claim 20, delete "layer," and insert -- layer; --, therefor.

Signed and Sealed this
Twenty-second Day of January, 2013

David J. Kappos
*Director of the United States Patent and Trademark Office*